United States Patent [19]
Brun et al.

[11] Patent Number: 4,929,282
[45] Date of Patent: May 29, 1990

[54] SILVER, THALLIUM, COPPER AND TELLURIUM-BASED THERMOELECTRICAL SEMICONDUCTIVE THERMOELECTRIC MATERIAL, PREPARATION AND APPLICATION TO THERMOELECTRIC CONVERTERS

[75] Inventors: Gérard Brun, Saint-Gely du Fesc; Rose-Marie Marin-Ayral, Montpellier; Maurice Maurin, Montpellier; Bernard Pistoulet, Montpellier; Jean-Claude Tedenac, Frontignan, all of France

[73] Assignee: Centre National de la Recherche Scientifique, Paris, France

[21] Appl. No.: 124,783
[22] PCT Filed: Feb. 17, 1987
[86] PCT No.: PCT/FR87/00041
  § 371 Date: Apr. 19, 1988
  § 102(e) Date: Apr. 19, 1988
[87] PCT Pub. No.: WO87/05154
  PCT Pub. Date: Aug. 27, 1987

[30] Foreign Application Priority Data
Feb. 19, 1986 [FR] France ............... 86 02226

[51] Int. Cl.$^5$ ............................... H01L 35/20
[52] U.S. Cl. .................. 136/239; 136/241; 136/201
[58] Field of Search .............. 136/201, 239, 241

[56] References Cited
U.S. PATENT DOCUMENTS 3,852,118 12/1974 Hampl, Jr. ............... 136/238
3,853,632 12/1974 Hampl, Jr. ............... 136/241 X
3,932,291 1/1976 Donohue ................. 252/518 X
4,589,918 5/1986 Nishida et al. ............ 136/239 X

FOREIGN PATENT DOCUMENTS 28697 11/1972 Austria.
1388482 1/1965 France.
2566585 12/1985 France.
578187 6/1946 United Kingdom.

*Primary Examiner*—Peter A. Nelson
*Attorney, Agent, or Firm*—Sughrue, Mion, Zinn, Macpeak & Seas

[57] ABSTRACT

Silver, thallium, copper and tellurium-based thermoelectric semiconductor materials, characterized in that they are represented by the general formula (I)

$$Ag_xCu_yTlTe_{1+z} \qquad (I)$$

wherein, x, y and z verify the ratios:

$0.55 < x < 0.75$; $0.25 < y < 0.40$ and $0 < z < 0.10$.

4 Claims, No Drawings

SILVER, THALLIUM, COPPER AND TELLURIUM-BASED THERMOELECTRICAL SEMICONDUCTIVE THERMOELECTRIC MATERIAL, PREPARATION AND APPLICATION TO THERMOELECTRIC CONVERTERS

SUMMARY

The invention concerns silver, thallium, copper and tellurium-based thermoelectric semiconductor thermoelectric material, represented by the general formula (I):

$$Ag_xCu_yTlTe_{1+z} \qquad (I)$$

with $0.55 < x < 0.75$; $0.25 < y < 0.40$ and $0 < z < 0.10$.

They are obtained by mixing silver, copper, thallium and tellurium powder, heating at about 500° C., under vacuum or under inert atmosphere, slow cooling up to room temperature. in order to obtain an ingot, then The invention concerns a new thermoelectric material with a high figure of merit, which can be used for thermoelectric conversion of energy, especially at room temperature, a preparation process, as well as the thermoelectric converter obtained from such material.

In a thermoelectric converter (or Peltier effect) an electrical current which flows through the junction at the two p type and n type semiconductors, induces a release or an absorption of heat, according to the direction of the current. That effect is used in various cooling, heating and temperature control devices. For instance, in a cooling device these semiconductor pellets are typically aligned electrically in series and thermally in parallel, making a series of p and n junctions that create a cooling effect when electrons flow from the p to the n pellet.

The coefficient of performance (COP) of a heat pump, in other words the ratio of the quantity of heat released at the hot source (or absorbed at the cold source) to electrical energy supplied at the pump, increases with Z, the thermo element figure of merit. That figure of merit Z depends on the thermoelectric power S (or Seebeck coefficient expressed in V/°K), the electrical conductivity $\sigma$ ($\Omega^{-1}$ cm$^{-1}$) and conductivity X (W/cm.°K) of the material, by the relation of the thermal conductivity X:

$$Z = S^2 \sigma / X$$

The product ZT of the figure of merit by $T = (T_c + F_f)/2$, average temperature of the hot and cold functions, expressed in °K., determines the coefficient of performance and the efficiency of the thermoelectric converter. For a temperature T, close to the room temperature, the product ZT of an usual thermoelectric material such as bismuth telluride ($Bi_2Te_3$) or alloys that derived from it, is usually less than or at most equal to the unit. Hence, the coefficient of performance of the heat pumps executed with these materials is low.

The figure of merit Z of a specific semiconductor material can be brought to its optimal value Zopt with adequate doping (if we know how to carry that out). The Zopt value of a material can be deduced from the values of the thermoelectric power, and electric and thermal conductivities, measured on a sample of the same material, not ideally doped. We can show for instance, with Simon curves (Adv. Energy Conv. Vol. 1, 81–92, 1961–Ibid, Vol. 3, 515, 1830–J. Appl. Phys., Vol. 33, 1830–41, 1962), that the optimal coefficient ZT of the materials which are currently known cannot exceed significantly the unit in the temperature ranges where they can be used.

It seemed desirable therefore to produce thermoelectric materials with a higher figure of merit, (ZT > 1) of which the economic interest is especially significant for executions of static heat pumps which operate close to the room temperature. Various semiconductors have been studied, knowing that we can modify their figure of merit in doping or by stoichiometric deviation, in order to optimize their thermoelectric power and electrical conductivity.

French patent application 2,566,585 describes silver, thallium and tellurium-based thermoelectric semiconductor materials that can display a figure of merit close to 1 at room temperature, which can be used in the manufacturing of Peltier effect heat pumps.

The purpose of this invention is a new class of thermoelectric semiconductor compounds which possess a high figure of merit, that can be used for thermoelectric conversion of energy, especially in the Peltier effect heat pumps, within a temperature range from about $-100°$ C. to $+100°$ C., as well as a process for preparing those materials.

The new thermoelectric semiconductor materials according to the invention can be represented by the general formula (I):

$$Ag_xCu_yTlTe_{1+z} \qquad (I)$$

wherein x, y and z verify the following ratios:

$0.55 < x < 0.75$; $0.25 < y < 0.40$ and $0 < z < 0.10$.

The above formula defines a range of solid solution in the quaternary diagram Ag-Cu-Tl-Te.

The thermoelectric semiconductor material with the above formula (I) are in the form of a solid solution of which the electrical characteristics are more favorable than those of the known compounds Ag-Tl-Te.

It is important for the values of x, y and z to respect the ratios indicated above. Otherwise, the resulting properties should be less favorable. For instance, if x is greater than 0.75, we obtain a two-phase solution, which makes grain boundaries appear, and hence the value of the figure of merit is reduced.

Those new semiconductor thermoelectric materials possess a high figure of merit (in other words ZT usually greater than (1) within a range of ±100° C. around the room temperature. Those are type p materials.

The above-mentioned formula (I) semiconductor materials can be prepared with the usual techniques, from base metals (silver, copper, thallium and tellurium) mixed by fusion slow cooling around the crystallizing point and annealed.

We know that characteristics such as thermoelectric power and electrical conductivity, which condition the figure of merit, depend on the mobility of the carriers and are influenced by impurities and defects of the semiconductor material. Therefore, it is advantageous to be able to prepare a material that is exempt from impurities and defects. To that end, it is necessary to mix and to melt the metal powders of silver, copper, thallium and tellurium in vacuum or in inert atmosphere to avoid any oxidation. Then we can proceed with directional solidification according to Bridgman's methods, or Bridgman modified, or perform a crystal pulling, a seed being withdrawn from the melted material.

More particularly the base metals under powdered form (silver, thallium, copper, tellurium) are intimately mixed in amounts that correspond to the desired stoichiometry, then that mixture is heated to the melting point in a quartz tube that is sealed under vacuum. All that is needed as to heat at a temperature higher than fusion temperature for several hours, for instance about 4 to 10 hours at 500° C., to obtain a homogeneous molten environment. We slowly cool, at 5 to 10° C. per hour, up to about the room temperature. Thus, we obtain a polycrystalline ingot, which is ground, preferably away from air, before being molten to perform directional solidification, as stated above.

Directional solidification according to Bridgman's method (T° gradient of 2° C/mm, run rate in the gradient 0.15 to 0.3 mm/hr, temperature of crystallization 485° C.) makes it possible to obtain a polycrystalline ingot of the thermoelectric material.

Those preparation methods concern a bulk material. Alternatively, it is possible to undertake with that type of compound the preparation of thin layers using techniques, such as chemical vapor deposition (CVD), or organic metal vapor deposition (OMVCD) by cracking at about 500° C., and inducing the deposition of the metal, or by deposition assisted plasma (PCVD).

The thermoelectric material of formula (I) that are obtained as stated above, consistant with the invention, are distinguished from known materials in that they possess a coefficient ZT close to 1, or greater, between $-100°$ C. and $+100°$ C. The typical values measured in the vicinity of room temperature can be greater than or equal to 1.7 in some instances. The interest of such materials proceeds from their thermal conductivity lower than $0.4 W^{-1}m.K^{-1}$, and their high electrical conductivity resulting from the great carriers mobility (of about 100 cm2/Vs, if not more at room temperature). Electrical conductivity results not only from the composition of the material within the framework of formula (I) mentioned above, but also from the carriers mobility which depends on crystallographic quality, and can be lessened by the presence of impurities or grain boundaries. The value of the coefficient ZT can therefore vary substantially for the same composition.

As indicated above, the type p thermoelectric semiconductor materials obtained according to the invention can be used for the execution of heat pumps. They can be associated with the classical n type semiconductors. To that end, these semiconductor pellets are typically aligned electrically in series and thermally in parallel forming modules. Electrical insulation between the various hot solders on one hand, and the cold solders on the other hand while ensuring good thermal contact between the hot source and the cold source, is ensured with thin layers of insulating ceramics, or other insulating materials that have good thermal conductivity. Such heat pumping systems should possess a significantly improved coefficient of performance (COP) compared to the systems used at the present time.

The following examples illustrate the invention in greater detail without restricting its range.

EXAMPLE 1

$Ag_{0.62}Cu_{0.30}TlTe_{1.05}$

We mix inside a grinder 8.99 g of thallium 3.16 g of silver, 5.50 g of tellurium and 0.82 g of copper, in the form of powder, by working in an environment safe from air to avoid any oxidation. The mixture is introduced inside a quartz tube to be heated as follows.

The mixture is melted for about 12 hours, then let cool until the temperature comes close to the room temperature.

Thus, a polycrystalline ingot is obtained. The ingot is ground, safe from air, introduced inside a Bridgman tube tape ended and heated to liquid estate at 450° C. for about 24 hours. Then a run is performed inside the furance at a speed of 0.35 mm/hr (temp. gradient 2° C/mm). It takes 4 weeks long to the end of the process. An ingot is obtained that displays cracks, from which samples are removed to perform measurements of the properties of the material.

Electrical conductivity of the semiconductor thus obtained equals $140\Omega^{-1}cm^{-1}$, thermoelectric power 350 VK$-1$, and its thermal conductivity 0.3 Wm$^{-1}$K$^{-1}$. Those values correspond to a coefficient ZT which equals 1.7.

EXAMPLE 2

$Ag_{0.68}Cu_{0.26}TlTE_{1.05}$

We proceed as in Example 1 with 8.99 g of thallium, 3.47 g of silver, 5.50 g of tellurium and 0.71 g of copper.

Thus, we obtain a semiconductor material of which the electrical conductivity equals $50\Omega^{-1}cm^{-1}$, the thermoelectric power 370 VK$^{-1}$ and thermal conductivity 0.3 Wm$^{-1}$K$^{-1}$.

EXAMPLE 3

$Ag_{0.64}Cu_{0.28}TlTe_{1.05}$

We proceed as in Example 1 with 9.0 g of thallium, 3.26 g of silver, 5.50 g of tellurium and 0.77 g of copper.

We obtain thus a semiconductor material with electrical conductivity of 80 $\Omega^{-1}cm^{-1}$, a thermoelectric power of 320 VK$^{-1}$, and thermal conductivity of 0.3 Wm$^{1-1}$K$^{-1}$.

We claim:

1. Silver, thallium, copper and tellurium-based thermoelectric semiconductor materials, characterized in that they are represented by the general formula (I)

$$Ag_xCu_yTlTe_{1+z} \qquad (I)$$

wherein, x, y and z are:

$0.55 < x < 0.75$; $0.25 < y < 0.40$ and $0 < z < 0.10$.

2. Thermoelectric semiconductor materials according to claim 1, characterized in that x is comprised from 0.60 to 0.70.

3. A thermoelectric semiconductor material according to claim 2, characterized in that it is represented by the formula $Ag_{0.62}Cu_{0.30}TlTe_{1.05}$.

4. A Peltier effect thermoelectrical converter which includes at least one pair of p type and n type semiconductor elements, characterized in that the p type element is made from a semiconductor material according to any one of claims 1 to 3.

* * * * *